United States Patent [19]

Arcilesi et al.

[11] Patent Number: 4,814,205

[45] Date of Patent: Mar. 21, 1989

[54] PROCESS FOR REJUVENATION ELECTROLESS NICKEL SOLUTION

[75] Inventors: Donald A. Arcilesi, Mt. Clemens; Roy W. Klein, St. Clair Shores, both of Mich.

[73] Assignee: OMI International Corporation, Warren, Mich.

[21] Appl. No.: 49,365

[22] Filed: May 14, 1987

Related U.S. Application Data

[63] Continuation-in-part of Ser. No. 556,417, Dec. 2, 1983, abandoned.

[51] Int. Cl.$^4$ .............................. B05D 3/4; B05D 3/10
[52] U.S. Cl. .................................... 427/305; 427/322; 427/404; 427/443.1
[58] Field of Search ............ 427/305, 322, 404, 443.1

Primary Examiner—Bernard Pianalto

Attorney, Agent, or Firm—Richard P. Mueller

[57] ABSTRACT

An aqueous initiator solution and process for rejuvenating such initiator solutions and for prolonging the useful operating life thereof by which copper and copper alloy substrates are treated therein to render them receptive to a subsequent electroless nickel plating step. The detrimental effects of progressive contamination of such aqueous initiator solutions with metal ion complexing agents during commercial use and/or precipitation of the noble metal ions which pregressively impairs the oprativeness of such activator solutions is overcome in accordance with the present invention by the addition of controlled amounts of ferric ions effective to maintain at least a sufficient portion of the noble metal ions in solution in a noncomplexed condition whereby the initiator solution is effective to pretreat the copper substrate prior to electroless nickel plating.

13 Claims, No Drawings

PROCESS FOR REJUVENATION ELECTROLESS NICKEL SOLUTION

This is a continuation-in-part of application Ser. Number 556,417 filed Dec. 2, 1983 now abandoned.

BACKGROUND OF THE INVENTION

The present invention is broadly applicable to the deposition of a metallic plating on polymeric plastic substrates, and more particularly to an improved initiator solution and process for treating copper and copper alloy coatings, to render them receptive to the electroless deposition of nickel on copper and copper alloy coatings.

An electroless copper plating followed by an electroless nickel plating has been found to be a very useful composite metallic coating on polymeric substrates such as electrical component housings because of the excellent electromagnetic interference (EMI) shielding which is provided by such coating. The deposition of about 20 to about 40 microinches of electroless copper on such a polymeric substrate provides the requisite EMI shielding and the subsequent electroless nickel overplate provides for improved corrosion resistance and decorative appearance of the composite plate.

A continuing problem has been encountered in effecting a uniform electroless nickel deposit on copper or copper alloy substrates in that the electroless nickel process is somewhat unpredictable depending upon the specific type of electroless nickel process employed. Generally, electroless nickel processes can be categorized as being of the high temperature (175° to 212° F.) acid process and the low temperature (75° to 160° F.) alkaline process. Initiation of a nickel deposit will occur much faster from hot acid electroless nickel processes than in lower temperature alkaline electroless nickel processes in which the initiation time may exceed 30 minutes which is commercially unsatisfactory. The initiation time as herein used is defined as the period commencing when a copper substrate is immersed into the bath and ending when the nickel plating commences. In order to reduce the initiation time, three general methods are currently in use to effect fairly rapid initiation of an electroless nickel plate on copper and copper alloy surfaces which include the electrolytic deposition of an initial nickel strike, the direct reduction method in which the copper substrate is contacted with a reducing agent, and, finally, the cathodic cell method employing an aqueous solution containing noble metal ions such as gold or palladium to deposit catalytic reduction sites on the copper substrate by chemical displacement. Of the foregoing, the cathodic cell method is considered technically superior and is better adapted for high volume production installations.

In accordance with prior cathodic cell initiator techniques, a noble metal, particularly palladium is employed in the aqueous solution in which a previously electroless copper plated substrate is immersed for a controlled time period. It has been found, however, that after only several days of heavy production use, certain such palladium containing initiator solutions become ineffective necessitating disposal and replacement. Because of the relatively low concentration of palladium in the initiator solution, it is not presently economical to subject such waste initiator solutions to recovery of the valuable palladium constituents therein. In addition to the cost and waste disposal problems associated with the discarding of such spent initiator solutions, the progressive degradation of such solutions during use also causes erratic and unpredictable behavior of the substrates being treated in the electroless nickel plating solution detracting from the attainment of uniform nickel deposits thereon.

The present invention overcomes the problems and cost disadvantages associated with prior art noble metal initiator solutions by providing a composition which provides for a stabilization and prolonged effective operating life of such initiator solutions as well as a process for rejuvenating such initiator solutions which have been rendered ineffective or impaired due to the progressive contamination thereof particularly by organic metal ion complexing agents.

SUMMARY OF THE INVENTION

It has now been discovered that the rapid degradation and loss of effectiveness of such initiator solutions is at least in part attributable to the progressive contamination thereof by drag-in of residual solutions employed in the pretreatment and electroless copper plating of polymeric substrates including organic complexing agents present in the electroless copper plating bath. In view of the complex configuration of many such polymeric substrates including housings for electronic components, it is virtually impossible from a commercial standpoint to eliminate such detrimental drag-in. Experimental tests conducted have shown that as little as 0.3 percent by volume of a typical electroless copper plating solution can render a palladium initiator solution ineffective for initiating nickel deposition in a subsequent electroless nickel plating bath within commercially acceptable times.

It has been further discovered that the degradation and loss of effectiveness of such initiator solutions such as palladium initiator solutions is in part attributable due to a precipitation of palladium compounds including palladium metal rendering the solution less effective or totally inoperative for initiating nickel deposition in a subsequent electroless nickel plating bath.

Accordingly, the benefits and advantages of the present invention in accordance with the process aspects thereof include the rejuvenation of an aqueous initiator solution containing noble metal ions which has become ineffective due to a contamination with organic complexing agent from a prior electroless copper plating solution rendering it incapable of treating copper plated substrates to make them receptive to a subsequent electroless nickel plating step. In accordance with the process, bath soluble and compatible ferric metal ions are introduced into the impaired initiator solution in an amount sufficient to restore the initiator solution to effective operation and generally, are employed in amounts of about 10 mg/l to about 5 g/l.

In accordance with a further process aspect of the present invention, a stabilization and substantial prolongation of the useful operating life of such aqueous initiator solutions is achieved by adding controlled effective amounts of ferric ions to the initiator solution in anticipation of progressive contamination thereof with organic metal ion complexing agents and precipitation of the noble metal ions thereby maintaining the noble metal ions present in the initiator solution available for reaction with the copper and copper alloy substrates immersed therein assuring rapid and predictable uniform deposition of nickel in a subsequent electroless nickel plating step.

In accordance with the composition aspects of the present invention, an improved aqueous initiator solution is provided containing a controlled effective amount of noble metal ions present to effect rapid initiation of an electroless nickel deposit on the substrate following the pretreatment thereof in further combination with contaminating organic metal ion chelating agents and an effective amount of ferric ions. Preferably, the ferric ions are present in amounts of about 40 to about 500 mg/l.

Additional benefits and advantages of the present invention will become apparent upon a reading of the Description of the Preferred Embodiments taken in conjunction with the specific examples provided.

DESCRIPTION OF THE PREFERRED EMBODIMENTS

The composition and process of the present invention is particularly applicable for providing a composite copper and nickel electroless plating on polymeric substrates including platable plastics and polymeric plastics including acrylonitrile-butadiene-styrene (ABS), polyaryl ethers, polyphenylene oxide, polystyrene, polycarbonate, nylon or the like. Such electroless plating processes conventionally comprise a plurality of sequential pretreatment steps to render the polymeric substrate receptive to the application of the electroless copper plating. Conventionally, the pretreatment steps employed include a cleaning or series of cleaning steps, if necessary, to remove surface films or contaminating substances followed thereafter by an aqueous acidic etching step employing a hexavalent chromium solution to achieve a desired surface roughness or texture which enhances the mechanical interlock between the substrate surface and the metallic plating to be applied thereover. The etched substrate is subjected to one or a plurality of rinse treatments to extract and remove any residual hexavalent chromium ions on the surfaces of the substrate which may also include a neutralization step incorporating reducing agents to substantially convert any residual hexavalent chromium to the trivalent state. The rinsed etched substrate is thereafter subjected to activation treatment in an aqueous acidic solution containing a tin-palladium complex to form active sites on the surface of the substrate followed by one or more rinsing steps after which the activated surface is subjected to an accelerating treatment in an aqueous solution to extract any residual tin constituents or compounds on the surface thereof. The accelerated plastic part is again rinsed and thereafter subjected to an electroless plating operation to effect the deposition of a copper plate thereon over all or selected sections of the surface thereof whereafter the copper plated substrate is rinsed and subject to the activator treatment prior to the electroless nickel plating step.

Typical of plating processes for pretreatment of polymeric substrates are those described in U.S. Pat. Nos. 3,622,370; 3,961,109; 3,962,497 and 4,204,013 the general teachings of which are incorporated herein by reference and to which reference is made for further details of specific steps in the sequential pretreatment process. U.S. Pat. No. 3962,497 discloses a typical neutralization treatment while U.S. Pat. No. 3,011,920 and 3,532,518 disclose typical one-step activation treatments, the teachings of which are also incorporated herein by reference. U.S. Pat. No. 4,204,013 teaches typical compositions for etching, neutralizing, activating and electroless copper plating of polymeric substrates. Such electroless copper plating solutions contain organic complexing agents in an amount sufficient to maintain the copper ions in solution. Typical of such complexing agents are ethylene diamine tetra acetic acid, glucoheptonate, N,N,N',N' tetrakis (2-hydroxy propyl) ethylene diamine or the like.

The aqueous acid solution in accordance with the composition aspects of the present invention contains hydrogen ions in an amount to provide an acidic pH and usually, a pH of less than about 1. Acidification of the solution can be achieved by employing a variety of acidic substrates of which mineral acids are generally preferred and among which hydrochloric acid is particularly satisfactory. The activation solution, which, is substantially free of tin ions, further contains noble metal ions such as gold, platinum, palladium and mixtures thereof of which palladium itself constitutes a preferred material. The concentration of the noble metal ions can generally range from as low as about 0.5 mg/l to concentrations up to about 100 mg/l and higher. Generally higher concentrations are undesirable for economic considerations and in view of the fact that such concentrations above about 100 mg/l do not provide for any appreciable benefits over those obtained at relatively lower concentrations. Particularly satisfactory results are obtained when the noble metal ion concentration is controlled within a range of about 5 up to about 50 mg/l.

The copper or copper alloy substrate is contacted such as by immersion with the aqueous activator solution which is usually controlled at a temperature of about room temperature (60° F.) up to about 100° F. for periods of time of about 10 seconds up to about 5 minutes or longer. Typically, in high volume commercial operation, immersion times of about 15 seconds up to about 2 minutes have provided satisfactory pretreatment for the subsequent electroless nickel plating step. Pretreatment of the copper or copper alloy substrate in the activator solution is preferably done in the presence of bath agitation such as mechanical agitation, cathode rod agitation, and preferably air agitation which has further been surprisingly found to effect a redissolving of any noble metal precipitates formed in the activator bath in the presence of the ferric ions in the solution.

In addition to the foregoing constituents, the aqueous acidic initiator solution further contains controlled effective amounts of ferric ions present in an amount effective to stabilize and maintain the operating efficiency of the initiator solution over prolonged time periods as well as to rejuvenate an initiator solution the effectiveness of which has become impaired due to the presence of contaminating complexing agents and/or the precipitation of the noble metal ions present. It has been discovered that concentrations of the ferric ions as low as about 10 mg/l are effective while concentrations substantially higher than that can be employed up to a level below that at which excessive etching of the copper or copper alloy substrate occurs as a result of excessive oxidation attack by the ferric ions causing the copper substrate to deplate. The particular maximum concentration of ferric ions will vary in consideration of the duration of the initiation cycle, the temperature of the initiator solution and the acidity thereof. The higher the temperature, the longer the treatment time and the lower the pH of the initiator solution will necessitate a corresponding reduction in the permissible ferric ion concentration. Generally, the concentration of ferric ions is controlled within a range of about 10 mg/l up to about 5 g/l with concentrations of about 40 mg/l to about 500 mg/l being preferred.

The ferric ions are included in the initiator solution by the addition of bath soluble and compatible ferric salts or can be formed in situ by the addition of iron particles and/or ferrous salts or compounds which are subsequently oxidized to the ferric state such as by the use of various oxidizing agents, and preferably, by the bubbling of air or oxygen thrugh the bath as conventionally performed during air agitation thereof.

In the preparation of a fresh initiator solution, the ferric ion concentration can be controlled within the foregoing ranges with the concentration preferably increasing from the lower concentration toward the upper concentration during use of the solution to maintain stability and effectiveness thereof. In the process of rejuvenating an initiator solution which has become impaired due to the presence of contaminating complexing agents therein and/or the precipitation of the noble metal constituent, it is preferred to introduce the ferric ions by gradual addition in the presence of agitation to restore activity of the solution within a period of about one to about two hours. When an initiator solution has been impaired primarily due to precipitation of the noble metal ions therein, it is preferred to introduce the ferric ions in the presence of air agitation providing an oxidizing medium for redissolving the noble metal ions such as palladium in the solution in which they are effective to pretreat the copper substrate prior to the subsequent electroless nickel plating.

In order to further illustrate the composition and process of the present invention, the following specific examples are provided. It will be understood that the examples are provided for illustrative purposes and are not intended to be limiting of the scope of the invention as herein disclosed and as set forth in the subjoined claims.

EXAMPLE 1

A series of molded ABS plastic panels of a nominal size of about 3 inches by about 4 inches by about one-tenth inch thick comprised of a plastic commercially available under the designation PG 298 from Monsanto Chemical Company were subjected to a conventional preplating cycle including cleaning followed by a water rinse and an etch treatment in an aqueous acid solution containing 356 g/l chromic acid, 412 g/l sulfuric acid and 0.2 g/l of a perfluorinated proprietary wetting agent commerically available under the designation FC-98 from Minnesota Mining & Manufacturing Company for a period of 5 minutes at 140° F. The etched panels were thereafter cold water rinsed for 1 minutes at 70° F. followed by a neutralization treatment for a period of 5 minutes at 120° F. employing an aqueous solution containing 18 g/l hydrochloric acid and 3 g/l hydroxyl amine sulfate. The neutralized test panels were thereafter water rinsed for 1 minute at 70° F. and subjected to an activation treatment for a period of 5 minutes at 110° F. employing an aqueous acid solution containing 0.77 g/l palladium, 9 g/l stannous chloride, 35.2 g/l hydrochloric acid and 192 g/l sodium chloride. Following activation, the test panels were water rinsed for 1 minute at 70° F. and thereafter subjected to an acceleration treatment for a period of 1 minute at 75° F. in a 5 percent by volume aqueous solution of fluoboric acid followed by a water rinse for 1 minute at 70° F.

The pretreated test panels were thereafter subjected to an electroless copper plating step for a period of 10 minutes at a temperature of 140° F. containing 40 g/l EDTA tetrasodium salt, 4.2 g/l cupric chloride, 3 g/l formaldehyde and sodium hydroxide to provide a pH of about 12.3. A copper deposit of about 45 microinches was produced.

The copper plated test panels were thereafter water rinsed for 1 minute at 70° F. and immersed in an initiator soution for a period of 3 minutes, said solution being substantially free of tin ions and containing 50 mg/l palladium chloride and 1 percent by volume hydrochloric acid. The panels were thereafter rinsed for period of 1 minute at 70° F.

The resultant test panels were thereafter subject to an electroless nickel plating step for a period of 2 minutes at 85° F. containing 12 g/l nickel chloride hexahydrate, 18 g/l sodium hypophosphite and 23 g/l citric acid.

The initiation time was about 15 to 20 seconds after the test panels were immersed in the electroless nickel plating solution before a deposition of nickel on the test panels occurred. Following an electroless nickel plating for 2 minutes at 85° F., about 2 microinches of nickel deposit was obtained.

EXAMPLE 2

A second series of test panels were subjected to a preplating treatment and electroless copper and nickel plating sequence in accordance with the procedure as described in Example 1 except that 130 mg/l of EDTA tetrasodium salt was intentionally added to the palladium initiator solution to simulate a contamination thereof as may occur in conventional commercial practice. The test panels upon immersion in the electroless nickel solution had an initiation time of about 25 seconds before a nickel deposit commenced.

EXAMPLE 3

A third series of test panels were processed in accordance with the preplating and electroless copper and nickel plating sequence as previously described in Example 1 with the exception that 170 mg/l of EDTA tetrasodium salt was intentionally added to the aqueous palladium initiator solution. The test panels were subsequently immersed in the electroless nickel plating bath and after a period of 2 minutes immersion time, the test panels were still totally devoid of any nickel plate. This example demonstrates the detrimental effect of contaminating complexing agents present in the palladium initiator solution.

EXAMPLE 4

A fourth series of test panels were processed in accordance with the procedure as described in Example 3 with the exception that in addition to the 170 mg/l of EDTA tetrasodium salt, 170 mg/l of ferric chloride hexahydrate was added to the initiator solution. The ABS test panels upon immersion in the electroless nickel plating solution had an initiation time of about 25 seconds before the nickel plating of the surfaces thereof commenced. This example illustrates the rejuvenation of an initiator solution by the addition of a metal ion which had become impaired due to the presence of excessive amounts of complexing agents.

EXAMPLE 5

A fifth series of test panels were processed in accordance with the procedure and employing the solutions as described in Example 4 with the exception that the concentration of the EDTA tetrasodium salt complexing agent in the initiator solution was increased from 170 mg/l to 510 mg/l in the presence of 170 mg/l of ferric chloride hexahydrate. Upon immersion of the test panels in the electroless nickel plating solution, an initiation period of about 35 seconds was required to effect an initiation of the nickel deposit on the panels.

EXAMPLE 6

A sixth series of test panels were processed in accordance with the same procedure employing the same compositions as set forth in Example 5 with the exception that the concentration of ferric chloride hexahydrate was increased in the initiator solution from 170 mg/l to 300 mg/l in the presence of 510 mg/l of the EDTA tetrasodium salt complexing agent. Upon immersion of the test panels in the electroless nickel plating solution, an initiation period of only about 20 seconds was required to effect initiation of the nickel deposit on the test panels.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. In a process for treating a copper plated substrate, formed by treatment of such substrate with an electroless copper plating solution, with an aqueous acid initiator solution which contains noble metal ions and is substantially free of tin ions, to render said copper plated substrate receptive to a subsequent electroless nickel plating step, wherein said initiator solution has become ineffective due to contamination thereof with complexing agents from said electroless copper plating solution and/or precipitation of noble metal ions therein, the improvement which comprises adding to said initiator solution ferric ions in an amount sufficient to restore said initiator solution to effective operation.

2. The process of claim 1 wherein the addition of the ferric ions to the initiator solution is carried out in the presence of an oxidizing medium.

3. The process as defined in claim 1 in which said ferric ions are present in an amount of at least about 10 mg/l.

4. The process as defined in claim 1 in which said ferric ions are present in an amount below that at which excessive etching of the copper substrate occurs.

5. The process as defined in claim 1 in which said ferric ions are present in an amount up to about 5 g/l.

6. The process as defined in claim 1 in which said ferric ions are present in an amount of about 40 to about 500 mg/l.

7. The process as defined in claim 1 in which the step of introducing ferric ions into said initiator solution is performed by adding a bath soluble and compatible ferric compound thereto.

8. The process as defined in claim 7 in which said compound comprises ferric chloride.

9. The process as defined in claim 2 in which said ferric ions are present in an amount of at least about 10 mg/l.

10. The process as defined in claim 2 in which said ferric ions are present in an amount below that at which excessive oxidation attack of the copper coating to be plated occurs.

11. The process as defined in claim 2 in which said ferric ions are present in an amount up to about 5 g/l.

12. The process as defined in claim 2 in which said ferric ions are present in an amount of about 40 to about 500 mg/l.

13. The process as defined in claim 2 in which said oxidizing medium is performed by bubbling an oxygen-containing gas through initiator solution for a period of time sufficient in combination with said ferric ions present to effect a redissolution of at least a portion of said precipitate therein thereby restoring effective operation of said solution.

* * * * *